(12) United States Patent
Kang et al.

(10) Patent No.: US 11,650,502 B2
(45) Date of Patent: May 16, 2023

(54) POLYMER AND COMPOSITION FOR FORMING AN ANTI-REFLECTIVE FILM AND METHOD OF MANUFACTURING AN INTEGRATED CIRCUIT DEVICE USING THE ANTI-REFLECTIVE FILM

(71) Applicants: SAMSUNG ELECTRONICS CO., LTD., Suwon-si (KR); Dongjin Semichem Co., Ltd., Hwaseong-si (KR)

(72) Inventors: Miyeong Kang, Suwon-si (KR); Sukkoo Hong, Suwon-si (KR); Hyereun Kim, Suwon-si (KR); Jihyun Kim, Hwaseong-si (KR); Hyunjin Kim, Hwaseong-si (KR); Hyojung Roh, Hwaseong-si (KR); Jongkyoung Park, Hwaseong-si (KR); Jungyoul Lee, Hwaseong-si (KR)

(73) Assignees: SAMSUNG ELECTRONICS CO., LTD., Suwon-si (KR); DONGJIN SEMICHEM CO., LTD., Hwaseong-si (KR)

( * ) Notice: Subject to any disclaimer, the term of this patent is extended or adjusted under 35 U.S.C. 154(b) by 648 days.

(21) Appl. No.: 16/695,569

(22) Filed: Nov. 26, 2019

(65) Prior Publication Data
US 2020/0310249 A1 Oct. 1, 2020

(30) Foreign Application Priority Data
Mar. 28, 2019 (KR) .................. 10-2019-0036211

(51) Int. Cl.
| | | |
|---|---|---|
| *G03F 7/09* | (2006.01) | |
| *C08G 18/79* | (2006.01) | |
| *C08G 18/38* | (2006.01) | |
| *C09D 175/04* | (2006.01) | |
| *G03F 7/039* | (2006.01) | |
| *G03F 7/038* | (2006.01) | |

(52) U.S. Cl.
CPC ......... *G03F 7/091* (2013.01); *C08G 18/3802* (2013.01); *C08G 18/3819* (2013.01); *C08G 18/792* (2013.01); *C09D 175/04* (2013.01); *G03F 7/038* (2013.01); *G03F 7/039* (2013.01)

(58) Field of Classification Search
CPC .......... G03F 7/031; G03F 7/038; G03F 7/039; G03F 7/11; G03F 7/20; G03F 7/26; G03F 7/322; C08G 18/3802; C08G 18/3819; C08G 18/792; C08G 71/04; C08G 73/0644; C08G 73/0655; C09D 5/006; C09D 179/04; H01L 21/027
See application file for complete search history.

(56) References Cited

U.S. PATENT DOCUMENTS 8,039,202 B2 10/2011 Sui et al.
8,344,088 B2 1/2013 Kennedy et al.
(Continued)

FOREIGN PATENT DOCUMENTS

| CN | 1637027 | 7/2005 | |
|---|---|---|---|
| JP | 2005-250434 | 9/2005 | |
| JP | 2011-236154 A | * 11/2011 | ............... C07F 3/06 |
| JP | 2012-518812 | 8/2012 | |
| KR | 10-2017-0136189 | 12/2017 | |
| WO | 2012-033004 | 3/2012 | |

OTHER PUBLICATIONS

Machine English translation of JP 2011-236154 (Year: 2011).*
Chinese Office Action issued in corresponding CN Patent Application No. 202010005831.3 dated Mar. 22, 2023.

*Primary Examiner* — Jessica M Roswell
(74) *Attorney, Agent, or Firm* — F. Chau & Associates, LLC

(57) ABSTRACT

A polymer having a repeating unit represented by Formula 1:

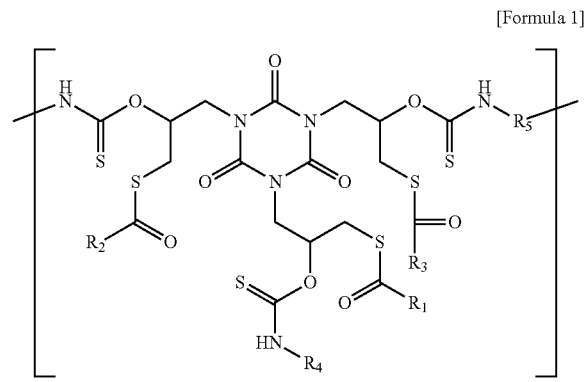

[Formula 1]

wherein each of $R_1$, $R_2$, and $R_3$ is independently selected from a substituted or unsubstituted C1-C6 chain-like saturated or unsaturated hydrocarbon group having 0 to 2 first heteroatoms or a substituted or unsubstituted C3-C6 cyclic saturated or unsaturated hydrocarbon group having 0 to 2 first heteroatoms, wherein at least one of $R_1$, $R_2$, and $R_3$ is a hydrocarbon group substituted with a fluorine atom. $R_4$ is a C1-C10 chain-like saturated or unsaturated hydrocarbon group having 0 to 2 second heteroatoms or a C3-C10 cyclic saturated or unsaturated hydrocarbon group having 0 to 2 second heteroatoms. $R_5$ is a C1-C10 chain-like saturated or unsaturated hydrocarbon group having 1 to 6 third heteroatoms or a C3-C10 cyclic saturated or unsaturated hydrocarbon group having 1 to 6 third heteroatoms.

13 Claims, 8 Drawing Sheets

(56) References Cited

U.S. PATENT DOCUMENTS

| | | |
|---|---|---|
| 8,383,318 B2 | 2/2013 | Meador |
| 8,557,877 B2 | 10/2013 | Mukhopadhyay et al. |
| 2007/0298349 A1 | 12/2007 | Zhang et al. |
| 2013/0236833 A1 | 9/2013 | Houlihan et al. |
| 2017/0351178 A1 | 12/2017 | Roh et al. |

* cited by examiner

POLYMER AND COMPOSITION FOR FORMING AN ANTI-REFLECTIVE FILM AND METHOD OF MANUFACTURING AN INTEGRATED CIRCUIT DEVICE USING THE ANTI-REFLECTIVE FILM

CROSS-REFERENCE TO RELATED APPLICATION

This application claims priority under 35 U.S.C. § 119 to Korean Patent Application No. 10-2019-0036211, filed on Mar. 28, 2019, in the Korean Intellectual Property Office, the disclosure of which is incorporated by reference in its entirety.

TECHNICAL FIELD

The present inventive concept relates to a polymer and composition used in a process of manufacturing an integrated circuit (IC) device and a method of manufacturing an IC device, and more particularly, to a polymer and composition for forming an anti-reflective film for a photolithography process and a method of manufacturing an IC device using the anti-reflective film.

DISCUSSION OF RELATED ART

Significant progress has been made with respect to downscaling IC devices and increasing the integration density of the IC devices which has resulted in the formation of IC devices having reduced design rules. New techniques for improving a dimensional precision have been required for patterns for implementing unit devices having fine critical dimensions (CDs). For example, it has become necessary to develop processes for preventing defects or deterioration of a process distribution due to undesired photoresist residue that may remain in an exposure area during a photolithography process.

SUMMARY

The present inventive concepts provide a polymer having a structure that may prevent undesired photoresist residue from being left in an exposure area during a photolithography process to prevent the occurrence of defects or degradation of a process distribution.

The present inventive concepts also provide a composition for forming an anti-reflective film including a polymer that may prevent undesired photoresist residue from being left in an exposure area during a photolithography process to prevent the occurrence of defects or degradation of a process distribution.

Furthermore, the present inventive concepts provide a method of manufacturing an integrated circuit (IC) device, which may prevent undesired photoresist residue from being left in an exposure area during a photolithography process to prevent occurrence of defects or degradation of a process distribution.

According to an aspect of the present inventive concepts, there is provided a polymer having a repeating unit represented by Formula 1:

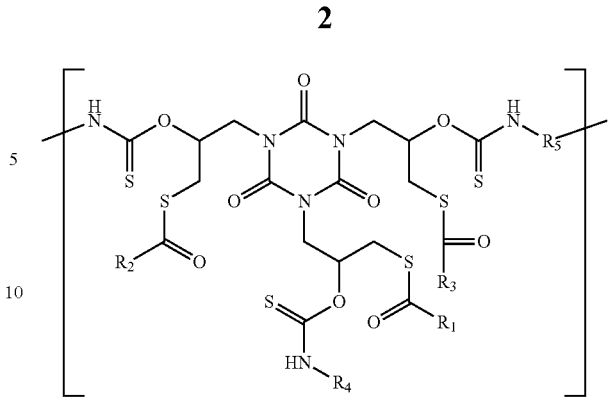

wherein each of $R_1$, $R_2$, and $R_3$ is independently selected from a substituted or unsubstituted C1-C6 chain-like saturated or unsaturated hydrocarbon group having 0 to 2 first heteroatoms or a substituted or unsubstituted C3-C6 cyclic saturated or unsaturated hydrocarbon group having 0 to 2 first heteroatoms, wherein at least one of $R_1$, $R_2$, and $R_3$ is a hydrocarbon group substituted with a fluorine atom. $R_4$ is a C1-C10 chain-like saturated or unsaturated hydrocarbon group having 0 to 2 second heteroatoms or a C3-C10 cyclic saturated or unsaturated hydrocarbon group having 0 to 2 second heteroatoms. $R_5$ is a C1-C10 chain-like saturated or unsaturated hydrocarbon group having 1 to 6 third heteroatoms or a C3-C10 cyclic saturated or unsaturated hydrocarbon group having 1 to 6 third heteroatoms.

According to another aspect of the present inventive concepts, there is provided a composition for forming an anti-reflective film, which includes a polymer having a repeating unit represented by Formula 1 and an organic solvent.

According to another aspect of the present inventive concept, there is provided a method of manufacturing an IC device. The method includes forming an anti-reflective film on a feature layer using a composition including a polymer having a repeating unit represented by Formula 1 and an organic solvent. A photoresist film is formed on the anti-reflective film. A first resist region of the photoresist film, which covers a first local region of the anti-reflective film, is exposed to light. The photoresist film is developed using a development agent to remove the exposed first resist region and to form a photoresist pattern. The developing of the photoresist film increases the hydrophilicity of a top surface of the first local region of the anti-reflective film.

According to another aspect of the present inventive concepts, there is provided a method of manufacturing an IC device. The method includes forming an anti-reflective film on a feature layer using a composition including a polymer having a repeating unit represented by Formula 1 and an organic solvent. The anti-reflective film includes a top surface having a first contact angle to deionized water (DIW). A photoresist film is formed to cover the top surface of the anti-reflective film. A partial region of the photoresist film is exposed to light. The photoresist film is developed using a development agent to form a photoresist pattern. The developing of the photoresist film increases the hydrophilicity of a top surface of a local region of the anti-reflective film that is not covered by the photoresist pattern.

According to another aspect of the present inventive concepts, there is provided a method of manufacturing an IC device. The method includes forming an anti-reflective film on a feature layer using a composition including an isocyanurate polymer including at least one fluorine-containing substituent. A photoresist film is formed to cover the anti-reflective film. A first resist region of the photoresist film is exposed to light. The first resist region covers a local region of the anti-reflective film. The photoresist film is developed using a development agent to remove the exposed first resist region and to increase the hydrophilicity of a top surface of the local region of the anti-reflective film.

BRIEF DESCRIPTION OF THE DRAWINGS

Exemplary embodiments of the present inventive concepts will be more clearly understood from the following detailed description taken in conjunction with the accompanying drawings in which.

DETAILED DESCRIPTION OF THE EXEMPLARY EMBODIMENTS

Figure 1:
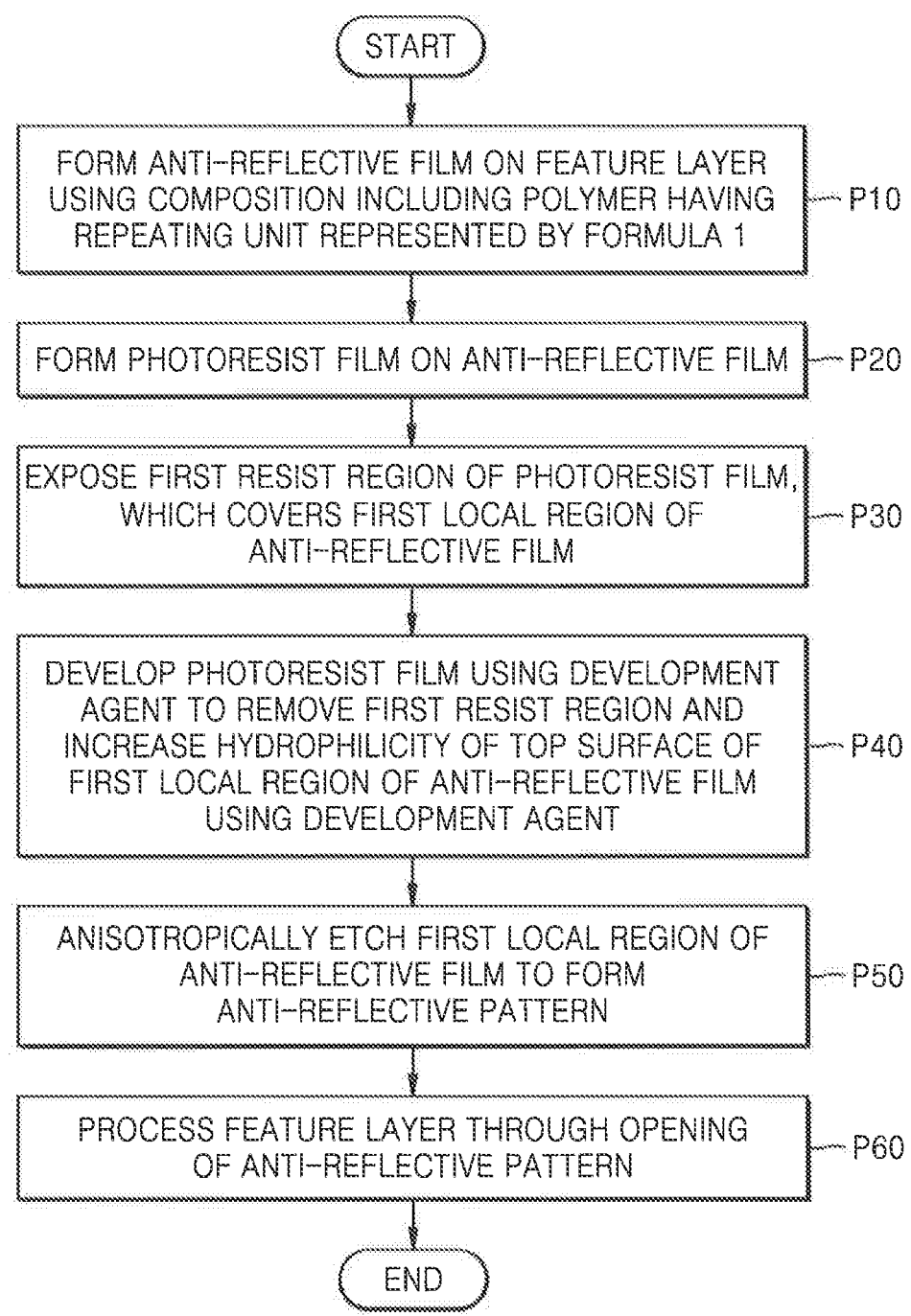
FIG. 1 is a flowchart of a method of manufacturing an integrated circuit (IC) device, according to an exemplary embodiment of the present inventive concepts.

Hereinafter, exemplary embodiments will be described in detail with reference to the accompanying drawings. The same reference numerals are used to denote the same reference elements in the drawings, and repeated descriptions thereof will be omitted.

A polymer for forming an anti-reflective film according to the present inventive concepts may have a repeating unit represented by Formula 1;

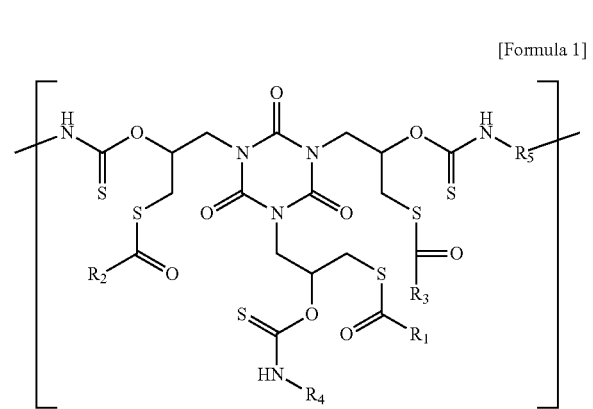

[Formula 1]

wherein each of $R_1$, $R_2$, and $R_3$ is independently selected from a substituted or unsubstituted C1-C6 chain-like saturated or unsaturated hydrocarbon group having 0 to 2 first heteroatoms or a substituted or unsubstituted C3-C6 cyclic saturated or unsaturated hydrocarbon group having 0 to 2 first heteroatoms, and at least one of $R_1$, $R_2$, and $R_3$ is a hydrocarbon group that is substituted with a fluorine atom. $R_4$ is a C1-C10 chain-like saturated or unsaturated hydrocarbon group having 0 to 2 second heteroatoms or a C3-C10 cyclic saturated or unsaturated hydrocarbon group having 0 to 2 second heteroatoms. $R_5$ is a C1-C10 chain-like or C3-C10 cyclic saturated or unsaturated hydrocarbon group having 1 to 6 third heteroatoms.

In some exemplary embodiments, the first heteroatom that may be included in $R_1$, $R_2$, and $R_3$ may be an oxygen atom O.

In some exemplary embodiments, each of $R_1$, $R_2$, and $R_3$ may be independently selected from a substituted or unsubstituted C1-C6 alkyl group, a substituted or unsubstituted C1-C6 heteroalkyl group, a substituted or unsubstituted C1-C6 alkoxy group, a substituted or unsubstituted C1-C6 heteroalkoxy group, a substituted or unsubstituted C2-C6 alkenyl group, a substituted or unsubstituted C2-C6 heteroalkenyl group, a substituted or unsubstituted C2-C6 alkynyl group, or a substituted or unsubstituted C2-C6 heteroalkynyl group.

In some exemplary embodiments, each of $R_1$, $R_2$, and $R_3$ may be independently selected from $-CF_3$, $-CH_2CF_3$, $-CF_2CF_3$, $-CF_2CF_2CF_3$, $-OC(CH_3)_3$, $-OCH_2CF_3$, $-OCF_3$, and $-OCF_2CF_3$, and at least one of $R_1$, $R_2$, and $R_3$ may include a fluorine atom.

In Formula 1, $R_1$, $R_2$, and $R_3$ may be the same as or different from each other. In an example, $R_1$, $R_2$, and $R_3$ may have the same structure. In another example, $R_2$ and $R_3$ may be the same as each other, and $R_1$ may have a different structure than those of $R_2$ and $R_3$. In another example, $R_1$ and $R_3$ may be the same as each other, and $R_2$ may have a different structure than those of $R_1$ and $R_3$. In a further example, $R_1$ and $R_2$ may be the same as each other, and $R_3$ may have a different structure than those of $R_1$ and $R_2$. In an exemplary embodiment, each of $R_1$, $R_2$, and $R_3$ may have a different structure from that of $R_4$.

The second heteroatom that may be contained in $R_4$ may be at least one selected from an oxygen atom O and a nitrogen atom N.

In some embodiments, $R_4$ may be selected from among the following structures:

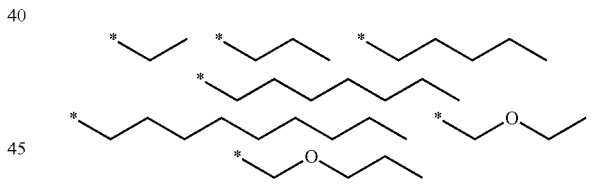

wherein * denotes a bonding position (e.g., a binding site to a neighboring atom).

In some other exemplary embodiments, $R_4$ may be selected from among the following structures:

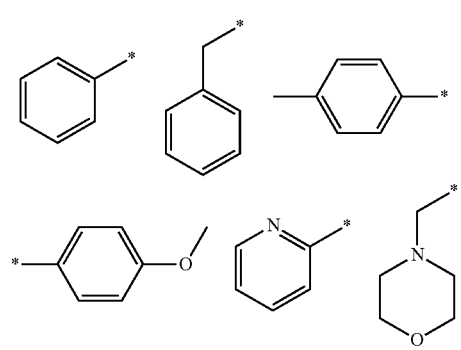

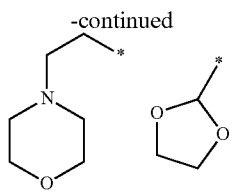

wherein * denotes a bonding position (e.g., a binding site to a neighboring atom).

In some exemplary embodiments, in Formula 1, $R_4$ may serve as a chromophore to absorb light.

The third heteroatom that may be contained in $R_5$ may be at least one selected from an oxygen atom O and a nitrogen atom N.

The first heteroatom, the second heteroatom and the third heteroatom may be the same as each other. Alternatively, one or more of the first heteroatom, the second heteroatom and the third heteroatom may be different from each other.

In some embodiments, $R_5$ may be selected from among the following structures:

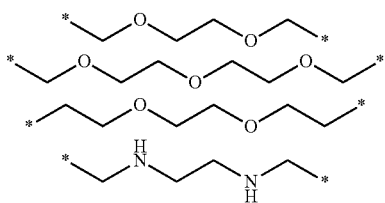

wherein * denotes a bonding position (e.g., a binding site to a neighboring atom).

The polymer having the repeating unit represented by Formula 1 may have a weight-average molecular weight Mw of about 1,000 to about 100,000. In an example, the weight-average molecular weight Mw of the polymer may range from about 2,000 to about 50,000. In another example, the weight-average molecular weight Mw of the polymer may range from about 2,000 to about 10,000. When the weight-average molecular weight Mw of the polymer is less than about 1,000, it may be difficult to obtain a coating film having a uniform thickness during a process of coating an underlying structure (e.g., a substrate) with a composition including the polymer to form the anti-reflective film. When the weight-average molecular weight Mw of the polymer exceeds 100,000, the solubility of the polymer in an organic solvent may be excessively reduced. Therefore, it may be difficult to apply the polymer to the process of coating an underlying structure.

A composition for forming an anti-reflective film according to exemplary embodiments may include a polymer having a repeating unit represented by Formula 1 and an organic solvent.

In the composition, the polymer having the repeating unit represented by Formula 1 may be contained at a content of about 0.01 to 10% by weight, based on the total weight of the composition. In some exemplary embodiments, the amount of the organic solvent in the composition may be adjusted such that the content of solids including the polymer having the repeating unit represented by Formula 1 in the composition ranges from 0.01 to 10% by weight.

The organic solvent may include cyclohexanone, cyclopentanone, butyrolactone, dimethylacetamide, dimethyl formamide, dimethylsulfoxide, N-methyl pyrrolidone (NMP), tetrahydrofurfural alcohol, propylene glycol monomethyl ether (PGME), propylene glycol monomethyl ether acetate (PGMEA), ethyl lactate, or a combination thereof. However, exemplary embodiments of the present inventive concepts are not limited thereto and the organic solvent may be various other compositions.

In some exemplary embodiments, a composition for forming an anti-reflective film may further include a polymer having a repeating unit represented by Formula 2:

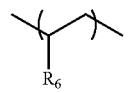

[Formula 2]

wherein $R_6$ is a C6-C12 saturated or unsaturated hydrocarbon group having 0 to 2 fourth heteroatoms.

In some exemplary embodiments, $R_6$ may serve as a chromophore to absorb light.

In some exemplary embodiments, $R_6$ may be a C6-C12 saturated or unsaturated hydrocarbon group having 0 to 2 oxygen atoms O. For example, $R_6$ may be any one selected from the following structures:

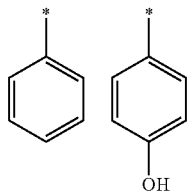

wherein * denotes a bonding position (e.g., a binding site to a neighboring atom).

When a composition for forming an anti-reflective film according to exemplary embodiments includes the polymer having the repeating unit represented by Formula 1 and the polymer having the repeating unit represented by Formula 2, a total content of the polymers in the composition may range from 0.01 to 10% by weight, based on the total weight of the composition.

In some exemplary embodiments, the composition for forming the anti-reflective film may further include at least one of a crosslinking agent and an acid generator.

The crosslinking agent may induce the cross-linking of the polymer included in the composition and cure the cross-linked polymer.

In some exemplary embodiments, the crosslinking agent may include a $C_4$ to $C_{50}$ hydrocarbon compound. For example, the crosslinking agent may include a resin containing melamines, methylols, glycolurils, polymeric glycolurils, benzoguanamine, urea, a resin containing hydroxyalkylamide, epoxy and epoxy amine resins, blocked isocyanates, or divinyl monomers. In some other exemplary embodiments, the crosslinking agent may include fluorine-containing or fluorine-free organic alcohols or epoxide substituents. In some other exemplary embodiments, a commercially available crosslinking agent may be used as the crosslinking agent, such as PL 1174 (Cytec Industries Inc., located in West Paterson, N.J.). However, exemplary embodiments of the present inventive concepts are not limited thereto and the crosslinking agent may be various other compositions.

The content of the crosslinking agent may range from about 0.01 to about 5% by weight, based on the total weight of the composition. For example, the content of the crosslinking agent may be about 0.05 to about 2% by weight. When the content of the crosslinking agent is less than 0.01% by weight, even if the underlying structure (e.g., the substrate) is coated with the composition and a bake process is performed to form the anti-reflective film using the composition, a crosslinking reaction may not be accurately achieved. Therefore, a sufficient crosslinking ratio required to form the anti-reflective film may not be obtained, and the anti-reflective film may exhibit a thickness loss. When the content of the crosslinking agent exceeds about 5% by weight, outgassing may occur due to the sublimation of an unreacted crosslinking agent, which remains after the anti-reflective film is formed. The outgassing may result in contamination of the underlying structure and apparatuses.

The acid generator may promote a crosslinking reaction of the polymers included in the composition. The acid generator may be a thermal acid generator (TAG). In some exemplary, embodiments, the TAG may include a sulfonium salt compound, an iodonium salt compound, an amine salt compound, or a combination thereof. For example, the TAG may include triphenylsulfonium nonaflate, dodecylbenzensulfonic acid, paratoluenesulfonic acid, pyridinium nonaflate, or a combination thereof. However, exemplary embodiments of the present inventive concepts are not limited thereto and the acid generator may be various other compounds.

The content of the acid generator may range from about 0.001 to about 0.5% by weight, based on the total weight of the composition. For example, the content of the acid generator may range from about 0.1 to about 0.3% by weight. When the content of the acid generator is less than about 0.001% by weight, the amount of the acid required for the crosslinking reaction may be insufficient. Therefore, the crosslinking reaction may not be completed in the resultant anti-reflective film. When the content of the acid generator exceeds about 0.5% by weight, the process stability may deteriorate due to an excessive acid catalyst.

The content of the organic solvent in the composition may correspond to the remaining content of the composition excluding the contents of the polymers included in the composition and additives, such as the crosslinking agent and the acid generator.

Hereinafter, a method of manufacturing an IC device, according to exemplary embodiments of the present inventive concepts, will be described.

FIG. 1 is a flowchart of a method of manufacturing an IC device, according to an exemplary embodiment of the present inventive concepts.

FIGS. 2A to 2G are cross-sectional views illustrating process operations of a method of manufacturing an IC device, according to exemplary embodiments of the present inventive concepts.

Figure 2A:
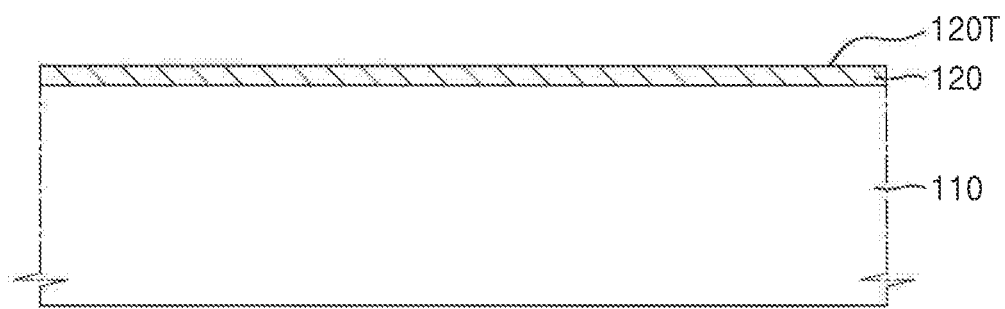
FIGS. 2A to 2G are cross-sectional views illustrating process operations of a method of manufacturing an IC device, according to exemplary embodiments of the present inventive concepts.

Referring to FIGS. 1 and 2A, in process P10, an anti-reflective film 120 may be formed on a feature layer 110 using a composition including a polymer having a repeating unit represented by Formula 1.

In some exemplary embodiments, the polymer included in the composition may include only a polymer having the repeating unit represented by Formula 1. In some other exemplary embodiments, the polymer included in the composition may include the polymer having the repeating unit presented by Formula 1 and a polymer having a repeating unit represented by Formula 2.

In some exemplary embodiments, the anti-reflective film 120 may include a resultant product of a crosslinking reaction of the polymer having the repeating unit represented by Formula 1. In some other exemplary embodiments, the anti-reflective film 120 may include a resultant product of a crosslinking reaction of the polymer having the repeating unit represented by Formula 1 and the polymer having the repeating unit represented by Formula 2.

In some exemplary embodiments, the feature layer 110 may include a semiconductor substrate. For example, the feature layer 110 may include a semiconductor, such as silicon (Si) or germanium (Ge), or a compound semiconductor, such as silicon germanium (SiGe), silicon carbide (SiC), gallium arsenide (GaAs), indium arsenide (InAs), indium phosphide (InP), etc. In some other exemplary embodiments, the feature layer 110 may include an insulating film or a conductive film. For example, the feature layer 110 may include a metal, an alloy, a metal carbide, a metal nitride, a metal oxynitride, a metal oxycarbide, a semiconductor, polysilicon, oxide, nitride, oxynitride, or a combination thereof. However, exemplary embodiments of the present inventive concepts are not limited thereto and the feature layer may include various other compounds.

The anti-reflective film 120 may control the irregular reflection of light from a light source that is used during an exposure process for manufacturing the IC device. In some exemplary embodiments, the anti-reflective film 120 may absorb light reflected by the feature layer 110 located thereunder. The anti-reflective film may include one or more chromophores for absorption of light.

In some exemplary embodiments, the formation of the anti-reflective film 120 may include coating the feature layer 110 with a composition for forming an anti-reflective film according to embodiments and annealing the coated composition to induce a crosslinking reaction of polymers included in the composition. The process of annealing the composition may be performed at a temperature of about 150° C. to about 400° C. for about 10 seconds to about 100 seconds. However, exemplary embodiments of the present inventive concepts are not limited thereto. During the annealing of the composition, the polymers included in the composition may be cured due to a crosslinking agent. In some exemplary embodiments, the anti-reflective film 120 may be formed to a thickness of about 20 nm to about 100 nm. However, the thickness of the anti-reflective film 120 is not limited thereto. For example, in some exemplary embodiments the thickness of the anti-reflective film may be less than 20 nm or greater than 100 nm.

In some exemplary embodiments, the composition may include a polymer having a repeating unit represented by Formula 1 and an organic solvent. In some other exemplary embodiments, the composition may include a polymer having a repeating unit represented by both Formula 1 and Formula 2. In yet some other exemplary embodiments, the composition may further include at least one of a crosslinking agent and an acid generator. Detailed descriptions of the polymer having the repeating unit represented by Formula 1, the polymer having the repeating unit represented by Formula 2, the crosslinking agent, and the acid generator may be understood with reference to the above descriptions.

After the anti-reflective film 120 is formed, substituents of the polymer having the repeating unit represented by Formula 1 may be exposed on a top surface 120T of the anti-reflective film 120. The substituents exposed on the top surface 120T of the anti-reflective film 120 may include at least one of $R_1$, $R_2$, and $R_3$. At least one of $R_1$, $R_2$, and $R_3$ may be a hydrocarbon group substituted with a fluorine atom. Accordingly, hydrocarbon groups substituted with fluorine atoms may be exposed on the top surface 120T of the anti-reflective film 120.

Figure 2B:
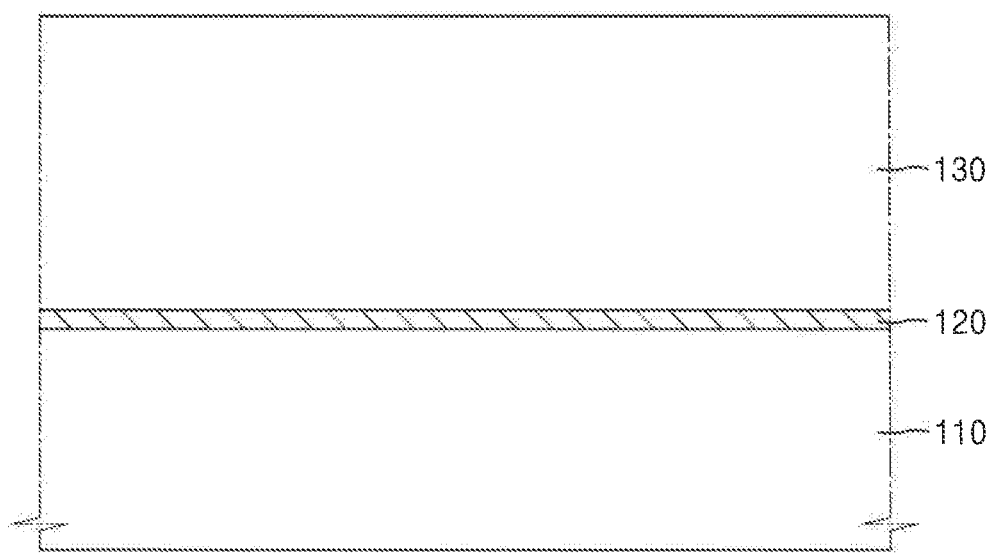

Referring to FIGS. 1 and 2B, in process P20, a photoresist film 130 may be formed on the anti-reflective film 120 formed in process P10. For example, as shown in the exemplary embodiment of FIG. 2B, the photoresist film 130 may be formed directly on the anti-reflective film 120.

In some exemplary embodiments, the photoresist film 130 may include a positive-type photoresist. The photoresist film 130 may include a resin having a polarity that is increased by an action of an acid. For example, the photoresist film 130 may include a resin containing an acid-decomposable group and a chemical-amplification-type photoresist including a photoacid generator (PAG). The photoresist film 130 may include 248-nm KrF excimer laser resist, 193-nm ArF excimer laser resist, 157-nm F2 excimer laser resist, or 13.5-nm extreme ultraviolet (EUV) resist. The photoresist film 130 may be formed using a spin coating process.

In an exemplary embodiment, the photoresist film 130 is formed by coating the anti-reflective film 120 with a photoresist composition and the photoresist composition is then annealed. The process of annealing the photoresist composition may be performed at a temperature of about 100° C. to about 150° C. for about 10 seconds to about 100 seconds. However, exemplary embodiments of the present inventive concepts are not limited thereto and the photoresist may be formed on the anti-reflective film 120 by other processes or by a coating and annealing process performed at different temperatures and/or time periods. Furthermore, a negative-type photomask may be used in other exemplary embodiments.

A thickness of the photoresist film 130 may be several tens to several hundred times greater than a thickness of the anti-reflective film 120. For example, in some embodiments, the photoresist film 130 may be formed to a thickness of about 1 μm to about 6 μm. However, the thickness of the photoresist film 130 is not limited thereto.

Figure 2C:
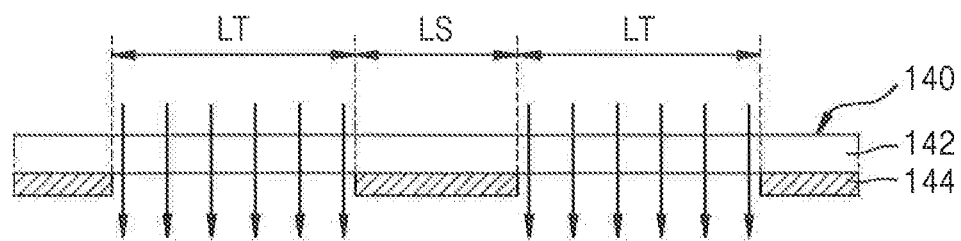
Figure 2C:
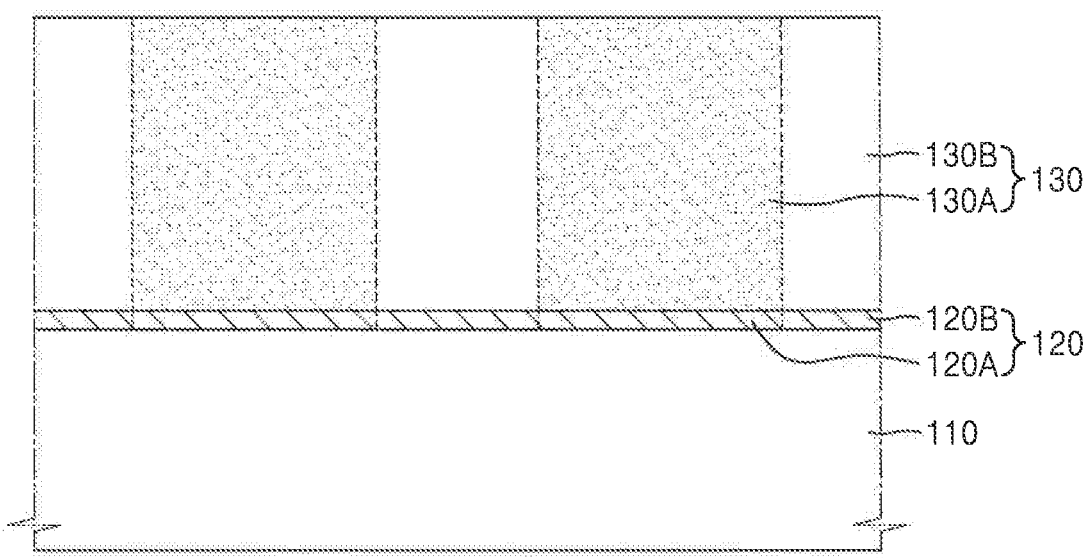

Referring to FIGS. 1 and 2C, in process P30, a first resist region 130A of the photoresist film 130, which covers a first local region 120A of the anti-reflective film 120, may be exposed to light applied during the photolithography process.

A second resist region 130B of the photoresist film 130 may be a non-exposure area. The first local region 120A of the anti-reflective film 120 may be covered by the exposed first resist region 130A, while a second local region 120B may be covered by the second resist region 130B, which is the non-exposure area.

A photomask 140 may be used to expose the first resist region 130A of the photoresist film 130. The photomask 140 may include a plurality of light-shielding areas LS and a plurality of light-transmitting areas LT. To expose the photoresist film 130, the photomask 140 may be aligned in a predetermined position on the feature layer 110, and the first resist region 130A of the photoresist film 130 may be exposed to light through the plurality of light-transmitting areas LT of the photomask 140.

The photomask 140 may include a transparent substrate 142 and a plurality of light-shielding patterns 144 formed on the transparent substrate 142. As shown in FIG. 2C, the light-shielding patterns may be disposed on a surface of the transparent substrate 142 that faces the feature layer 110. In an exemplary embodiment, the transparent substrate 142 may include quartz. In an exemplary embodiment, the plurality of light-shielding patterns 144 may include chromium (Cr). The plurality of light-shielding patterns 144 may constitute a plurality of light-shielding areas LS. A plurality of light-transmitting areas LT may be defined by the plurality of light-shielding patterns 144.

Radiations having various wavelengths may be used to expose the first resist region 130A of the photoresist film 130. For example, the exposure process may be performed using an i-line (365-nm), 248-nm, 193-nm, extreme ultraviolet (EUV) (13.5-nm), or 157-nm exposure wavelength. In some exemplary embodiments, an immersion lithography process may be performed when the 193-nm exposure wavelength is used to expose the first resist region. In embodiments in which the immersion lithography process is used, a topcoat layer may be further formed to cover the photoresist film 130 before the exposure process to prevent a direct contact of an immersion liquid with the photoresist film 130 and to prevent components of the photoresist film 130 from immersing in the immersion liquid. In some other exemplary embodiments, even if the immersion lithography process is used, a fluorine-containing additive may be added to the photoresist film 130 and the topcoat layer may be omitted.

In the first resist region 130A of the photoresist film 130, an acid-decomposable group may be deprotected due to an acid, which is generated from the PAG due to the exposure process, and a polarity of the first resist region 130A may be larger than in other portions of the photoresist film 130.

Referring to FIGS. 1 and 2I), in process P40, the photoresist film 130 (refer to FIG. 2C) may be developed using a development agent 150 to remove the exposed first resist region 130A. The hydrophilicity of a top surface 120AT of the first local region of the anti-reflective film 120 may be increased using the development agent 150.

Figure 2D:
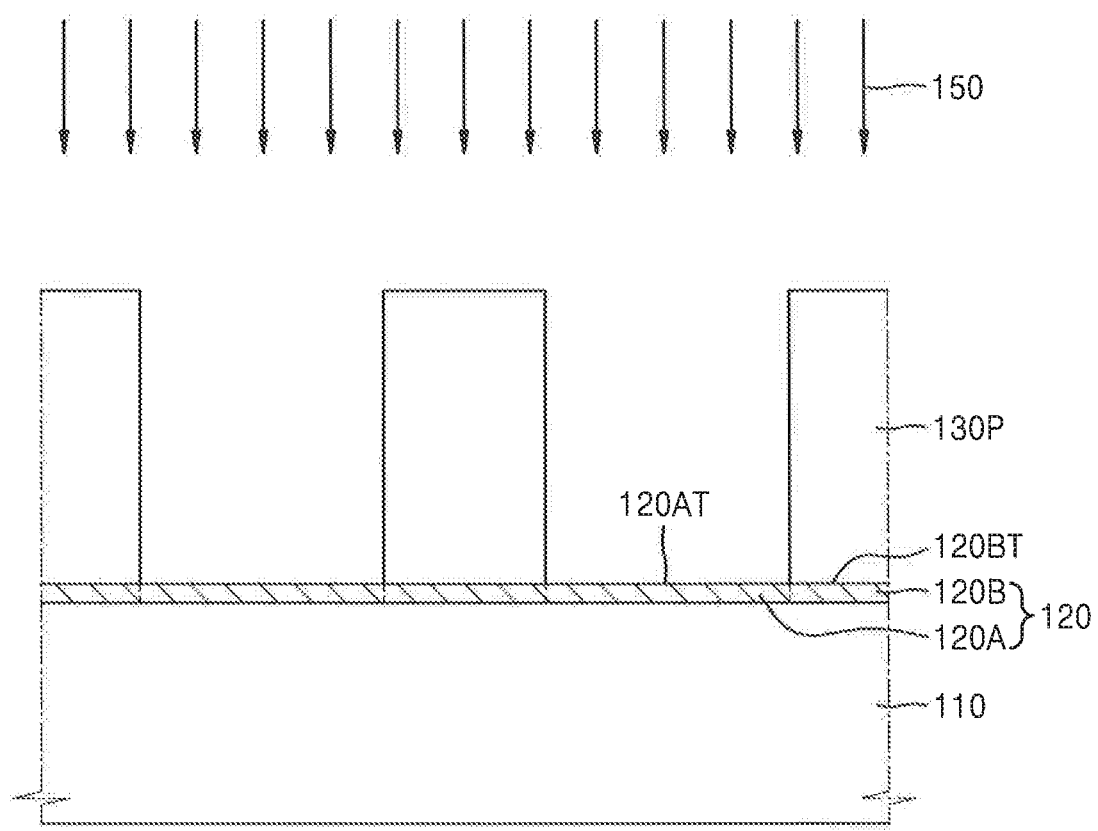

As shown in FIG. 2D, when the photoresist film 130 (refer to FIG. 2C) is developed using the development agent 150, the exposed first resist region 130A may be removed from the photoresist film 130 to form a photoresist pattern 130P. The photoresist pattern 130P may include the second resist region 130B (refer to FIG. 2C) of the photoresist film 130.

The development agent 150 may include a basic aqueous solution (e.g., a solution having a pH greater than 7.0). For example, in an exemplary embodiment, the development agent 150 may include a tetramethyl ammonium hydroxide (TMAH) aqueous solution. The TMAH aqueous solution may have a concentration of about 2 to about 5% by weight. For example, to develop the photoresist pattern 130P, the exposed photoresist film 130 shown in FIG. 2C may be developed for about 10 seconds to about 100 seconds using the TMAH aqueous solution.

While the photoresist pattern 130P is being formed by developing the photoresist film 130 using the development agent 150, the exposed first resist region 130A may be removed so that the top surface 120AT of the first local region 120A of the anti-reflective film 120 may be exposed to the development agent 150. A hydrocarbon group that is substituted with a fluorine atom included in at least one of R1, R2, and R3 included in the polymer having the repeating unit represented by Formula 1 may be exposed on the top surface 120AT of the first local region 120A. When the top surface 120AT of the first local region 120A of the anti-reflective film 120 is exposed to the development agent 150, the hydrocarbon group that is substituted with the fluorine atom included in at least one of R1, R2, and R3 may be dissolved due to a chemical reaction with the development agent 150 and deprotected from the polymer. As a result, the hydrophilicity of the top surface 120AT of the first local region 120A may be increased.

As the hydrophilicity of the top surface 120AT of the first local region 120A increases, a contact angle of the top surface 120AT of the first local region 120A to deionized water (DIW) may be less than before the development process described with reference to process P40 of FIG. 1 and FIG. 2D is performed.

In some exemplary embodiments, after the anti-reflective film 120 is formed as described with reference to process P10 of FIG. 1 and FIG. 2A, the top surface 120AT of the anti-reflective film 120 has a first contact angle to DIW. After the top surface 120AT of the first local region 120A of the anti-reflective film 120 undergoes a chemical reaction with the development agent 150 during the development process described with reference to process P40 of FIG. 1 and FIG. 2D, the top surface may have a second contact angle to DIW. The second contact angle may be less than the first contact angle. In some exemplary embodiments, the second contact angle may be at least 4 degrees (°) less than the first contact angle. In some other exemplary embodiments, the second contact angle may be at least 9° less than the first contact angle.

In some exemplary embodiments, the top surface 120AT of the first local region 120A of the anti-reflective film 120 which undergoes a chemical reaction with the development agent 150 as described with reference to process P40 of FIG. 1 and FIG. 2I), may have a smaller contact angle to DIW than the contact angle of a top surface 120BT of the second local region 120I of the anti-reflective film 120 which is covered by the photoresist pattern 130P and does not undergo a chemical reaction with the development agent. For example, the top surface 120BT of the second local region 120B may have a third contact angle to DIW after the photoresist film 130 is developed as described with reference to process P40 of FIG. 1 and FIG. 2D. The top surface 120AT of the first local region 120A may have a second contact angle to DIW, and the second contact angle may be less than the third contact angle. In some exemplary embodiments, the second contact angle may be at least 4° less than the third contact angle. In some other exemplary embodiments, the second contact angle may be at least 9° less than the third contact angle.

As the contact angle of the top surface 120AT of the first local region 120A of the anti-reflective film 120 to DIW is reduced and the hydrophilicity of the top surface 120AT of the first local region 120A increases after the photoresist film 130 is developed, a residue of the exposed first resist region 130A of the photoresist film 130 may be cleanly removed in process P40 without remaining on the top surface 120AT of the first local region 120A of the anti-reflective film 120. Accordingly, after the process of developing the photoresist film 130, problems caused by photoresist residue remaining on the top surface 120AT of the first local region 120A of the anti-reflective film 120 may be prevented.

According to exemplary embodiments, the anti-reflective film 120 may be formed using the composition including the polymer having the repeating unit represented by Formula 1. While the hydrocarbon group, which is substituted with the fluorine atom included in at least one of R1, R2, and R3, is dissolved due to a chemical reaction with the development agent 150 and deprotected from the polymer on the top surface 120AT of the first local region 120A, since the polymers included in the anti-reflective film 120 are cross-linked and form a matrix structure that is insoluble to the development agent 150, a substantial variation in the thickness of the anti-reflective film 120 may not be affected. Accordingly, the thickness of the first local region 120A of the anti-reflective film 120 may not exhibit a substantial change before and after the process of developing the photoresist film 130 using the development agent 150. For example, the reduction of the thickness of the first local region 120A of the anti-reflective film after the process of developing the photoresist film is performed may be no greater than 10-25 Å. Accordingly, as described with reference to process of FIG. 1 and FIG. 2D, the thickness of the first local region 120A of the anti-reflective film 120, which undergoes a chemical reaction with the development agent 150 during process P40 may be substantially equal to a thickness of the second local region 120B.

Figure 2E:
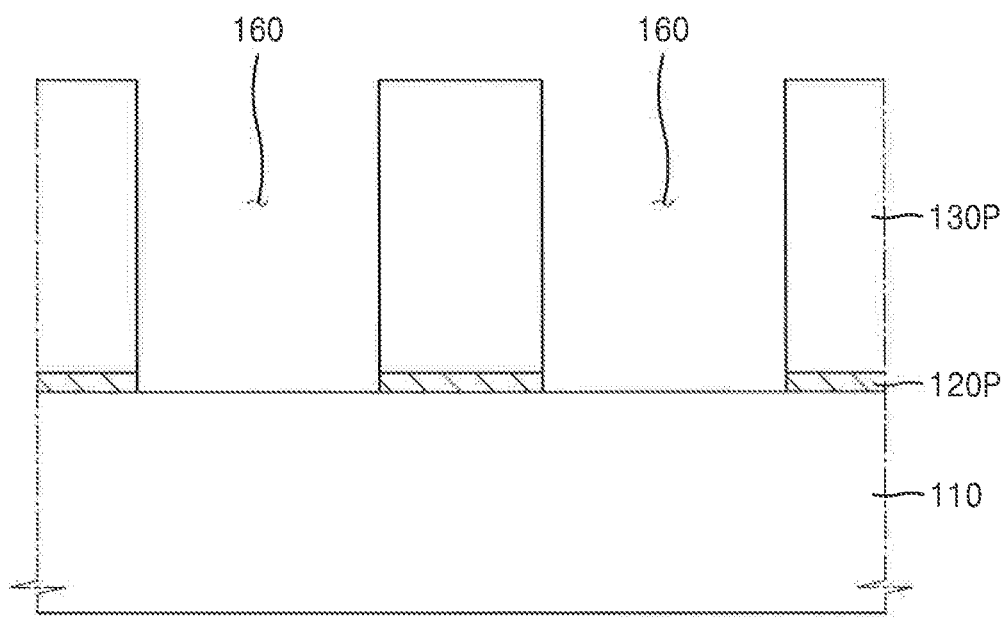

Referring to FIGS. 1 and 2E, in process P50, the first local region 120A (refer to FIG. 2D) of the anti-reflective film 120 may be anisotropically etched to form an anti-reflective pattern 120P in the second local region 120B. The anti-reflective pattern may be disposed below (e.g., covered by) the photoresist pattern 130P.

In embodiments in which a portion of the anti-reflective film 120 may be dissolved by the development agent 150 and the thickness of the anti-reflective film 120 is reduced after the process of developing the photoresist film 130 is performed, the thickness of the anti-reflective film 120 may not be uniform depending on a position of the anti-reflective film 120 on the feature layer 110. In these embodiments, when exposed portions of the anti-reflective film 120 are etched during a subsequent process, a process distribution may be degraded due to the non-uniform thickness of the anti-reflective film 120. This may adversely affect a profile of the anti-reflective pattern 120P, which is obtained after the etching of the anti-reflective film 120. Furthermore, after the developed portions of the anti-reflective film 120 are etched, a film-quality distribution or thickness distribution of underlying structures may be degraded.

However, in the method of manufacturing the IC, according to the exemplary embodiments of the present inventive concepts, when the photoresist film 130 is developed using the development agent 150 as described with reference to process P40 of FIG. 1 and FIG. 21), when the anti-reflective film 120 undergoes a chemical reaction with the development agent 150, there may be no substantial loss of thickness of the anti-reflective film 120. Accordingly, the anti-reflective pattern 120P, which is obtained as a result of the etching of the anti-reflective film 120, may have a desired vertical profile. Therefore, when the feature layer 110 is processed using the anti-reflective pattern 120P during a subsequent process, a desired critical dimension may be precisely controlled in a processing region of the feature layer 110.

After the anti-reflective pattern 120P is formed, a plurality of openings 160 may be formed in the anti-reflective pattern 120P and a photoresist pattern 130P to expose a portion of the feature layer 110.

Referring to FIG. 1, in process P60, the feature layer 110, which is exposed through the plurality of openings 160, may be processed using the anti-reflective pattern 120P and the photoresist pattern 130P as a mask pattern.

For example, the process of processing the feature layer 110 may include various processes, such as a process of implanting impurity ions into the feature layer 110 through the plurality of openings 160, a process of etching the feature layer 110 through the plurality of openings 160, a process of forming an additional film on the feature layer 110 through the plurality of openings 160, a process of modifying a portion of the feature layer 110 through the plurality of openings 160, etc.

Figure 2F:
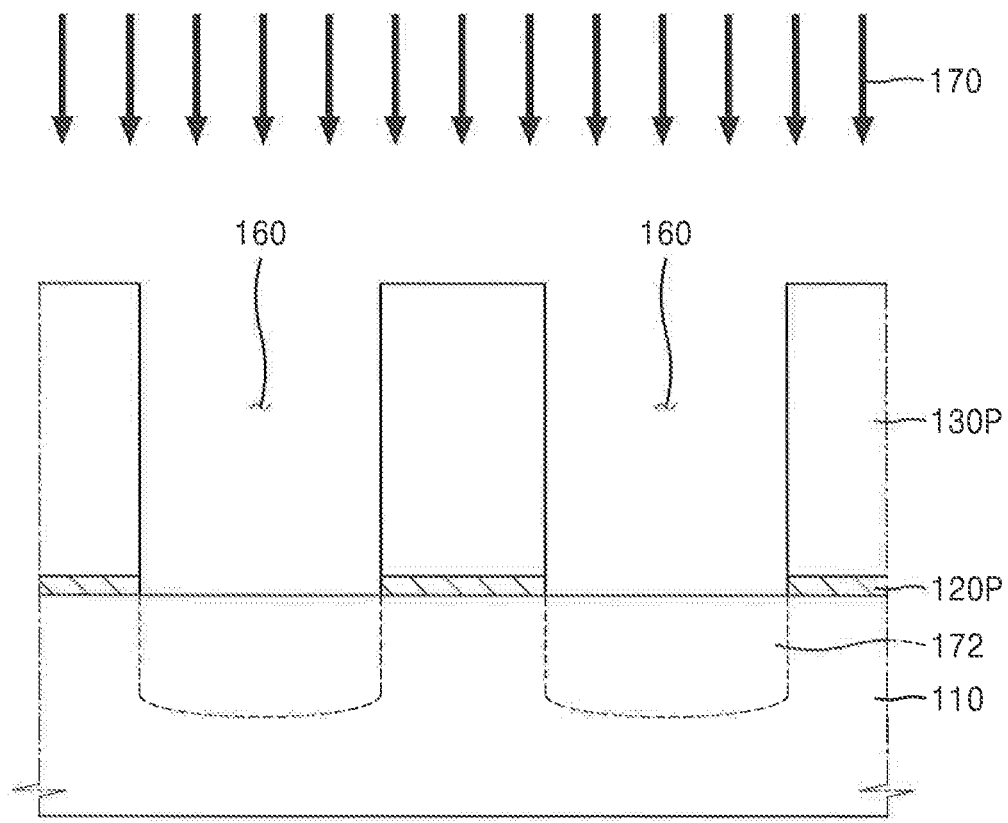

In the exemplary embodiment shown in FIG. 2F, an ion implantation process is performed as an example process of processing the feature layer 110 exposed through the plurality of openings 160. However, exemplary embodiments of the present inventive concepts are not limited thereto. As shown in FIG. 2F, impurity ions 170 may be implanted into the feature layer 110 through the plurality of openings 160, thereby forming a plurality of wells 172 in the feature layer 110. For example, the plurality of wells may extend into the thickness of the feature layer 110. Each of the plurality of wells 172 may include an impurity region into which the impurity ions 170 are implanted. The impurity ions 170 may be an n-type dopant or a p-type dopant. In embodiments in which the feature layer 110 includes a Group-IV semiconductor substrate (e.g., a Si substrate), the n-type dopant may include a Group-V element, such as phosphorus (P), arsenic (As), and antimony (Sb), and the p-type dopant may include a Group-III element, such as boron (B). However, exemplary embodiments of the present inventive concepts are not limited to the above-described examples, and the impurity ions 170 may be variously modified according to a material of the feature layer 110.

Figure 2G:
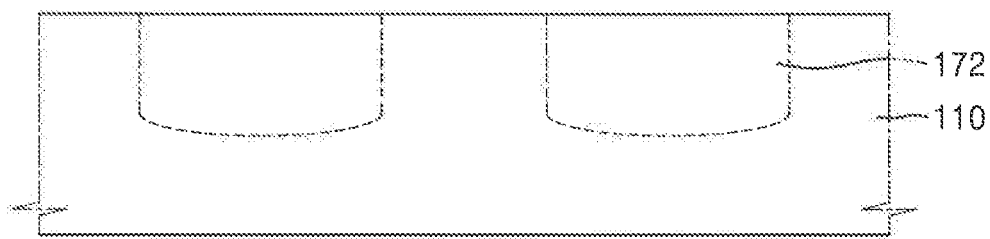

Referring to FIG. 2G, the anti-reflective pattern 120P and the photoresist pattern 130P that remains on the feature layer 110 after the processing of the feature layer in process P60 is performed may be subsequently removed. For example, an ashing process and a strip process may be used to remove the anti-reflective pattern 120P and the photoresist pattern 130P. However, exemplary embodiments of the present inventive concepts are not limited thereto and the anti-reflective pattern 120P and photoresist pattern 130P may be removed by various other methods known in the art.

In the method of manufacturing the IC device, according to the exemplary embodiments described with reference to FIGS. 1 and 2A to 2G, when the first local region 120A (refer to FIGS. 2D-2E) of the anti-reflective film 120 is anisotropically etched to form the anti-reflective pattern 120P, the anisotropic etching process may be performed without a process variation relative to a position of the anti-reflective film 120 on the feature layer 110. Therefore, when the feature layer 110 is processed using the anti-reflective pattern 120P and the photoresist pattern 130P, critical dimensions of processing regions or patterns to be formed may be precisely controlled to improve a dimensional precision.

Figure 3:
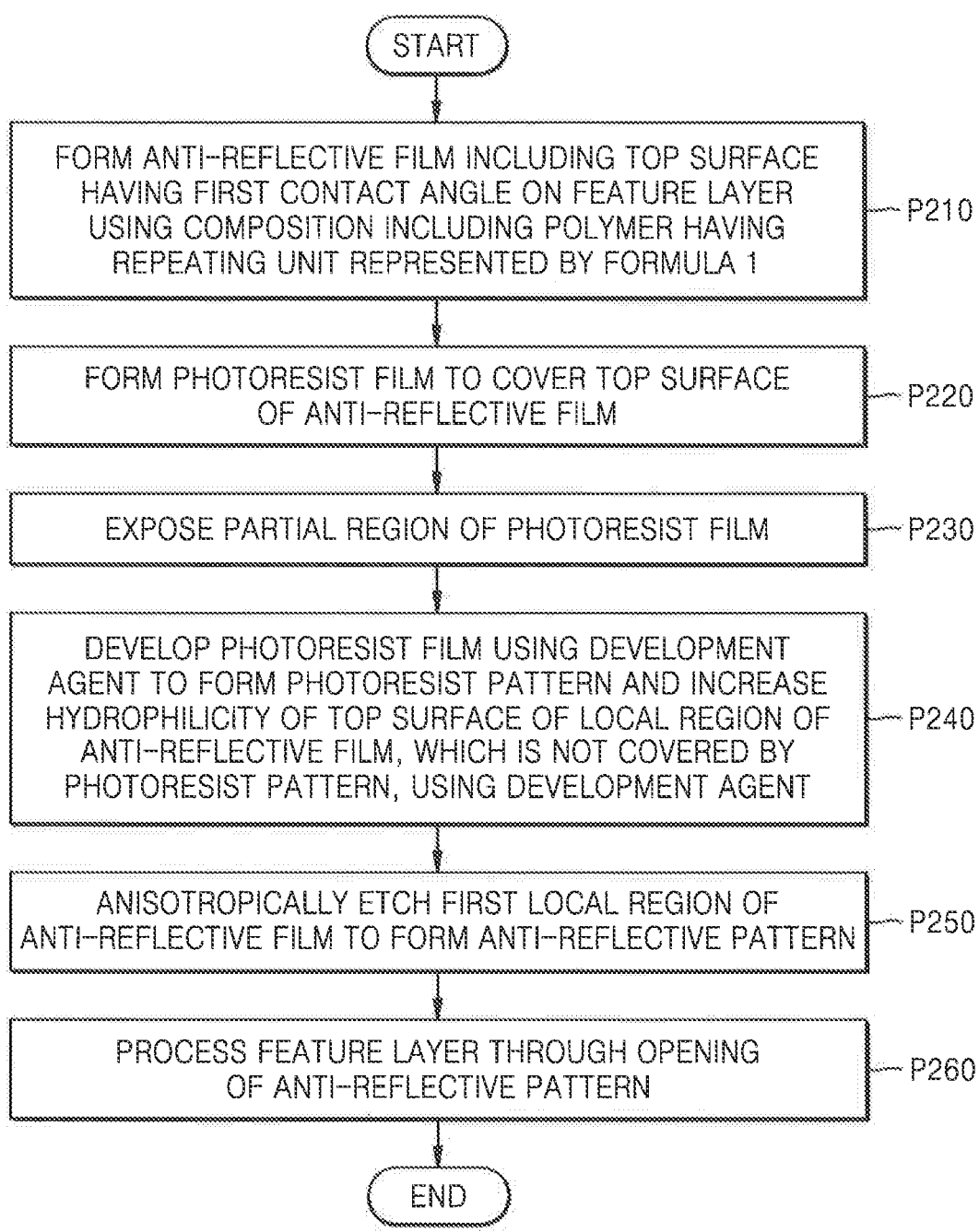
FIG. 3 is a flowchart of a method of manufacturing an IC device, according to exemplary embodiments of the present inventive concepts.

FIG. 3 is a flowchart of a method of manufacturing an IC device, according to an exemplary embodiment of the present inventive concepts.

The method of manufacturing the IC device, according to exemplary embodiments of the present inventive concepts, will be described with reference to FIGS. 2A to 2G and 3.

Referring to FIGS. 2A and 3, in process P210, an anti-reflective film 120 may be formed on a feature layer 110 using a composition including a polymer having a repeating unit represented by Formula 1 using the same method as that described in process P10 of FIG. 1.

In an exemplary embodiment, the top surface 120T of the anti-reflective film 120 may have a first contact angle of about 50° to 75° to DIW.

Referring to FIGS. 2B and 3, in process P220, a photoresist film 130 may be formed on the anti-reflective film 120 using the same method as that described in process P20 of FIG. 1.

Referring to FIGS. 2C and 3, in process P230, a partial region of the photoresist film 130 comprising the first resist region 130A may be exposed to light using the same method as that described in process P30 of FIG. 1.

Referring to FIGS. 2D and 3, in process P240, by performing the same method as that described in process P40 of FIG. 1, the photoresist film 130 (refer to FIG. 2C) is developed using the development agent 150 to form the photoresist pattern 130P, and the hydrophilicity of the top surface 120AT of the first local region 120A of the anti-reflective film 120, which is not covered by the photoresist pattern 130P, may be increased using the development agent 150.

As the hydrophilicity of the top surface 120AT of the first local region 120A increases, a contact angle of the top surface 120AT of the first local region 120A to DIW may be reduced. In some exemplary embodiments, the top surface 120AT of the first local region 120A may have a second contact angle to DIW that is at least 4° less than the first contact angle. In another exemplary embodiment, the second contact angle to DIW may be at least 9° less than the first contact angle. For instance, in an exemplary embodiment, the second contact angle may range from about 40° to about 65°. However, exemplary embodiments of the present inventive concepts are not limited thereto.

Referring to FIGS. 2E and 3, in process P250, the first local region 120A (refer to FIG. 2D) of the anti-reflective film 120 may be anisotropically etched using the same method as that described in process P50 of FIG. 1, thereby forming an anti-reflective pattern 120P.

Referring to FIG. 3, in process P260, the feature layer 110, which is exposed by a plurality of openings 160, may be processed using the anti-reflective pattern 120P and the photoresist pattern 130P as a mask pattern in the same manner as that described in process P60 of FIG. 1. H In some exemplary embodiments, an ion implantation process described with reference to FIG. 2F may be performed to process the feature layer 110 exposed through the plurality of openings 160. However, in other exemplary embodiments, various processes, such as a process of etching at least a portion of the feature layer 110, a process of forming an additional film on the feature layer 110 through the plurality of openings 160, and a process of modifying a portion of the feature layer 110 through the plurality of openings 160, may be performed to process the feature layer 110 exposed through the plurality of openings 160.

Thereafter, the anti-reflective pattern 120P and the photoresist pattern 130P remaining on the feature layer 110 may be removed in a similar manner to that described with reference to FIG. 2G.

In the method of manufacturing the IC device, according to the exemplary embodiments described with reference to FIGS. 2A to 2G and 3, when the feature layer 110 is processed using the anti-reflective pattern 120P and the photoresist pattern 130P, CDs of processing regions or patterns to be formed may be precisely controlled to improve a dimensional precision.

Figure 4:
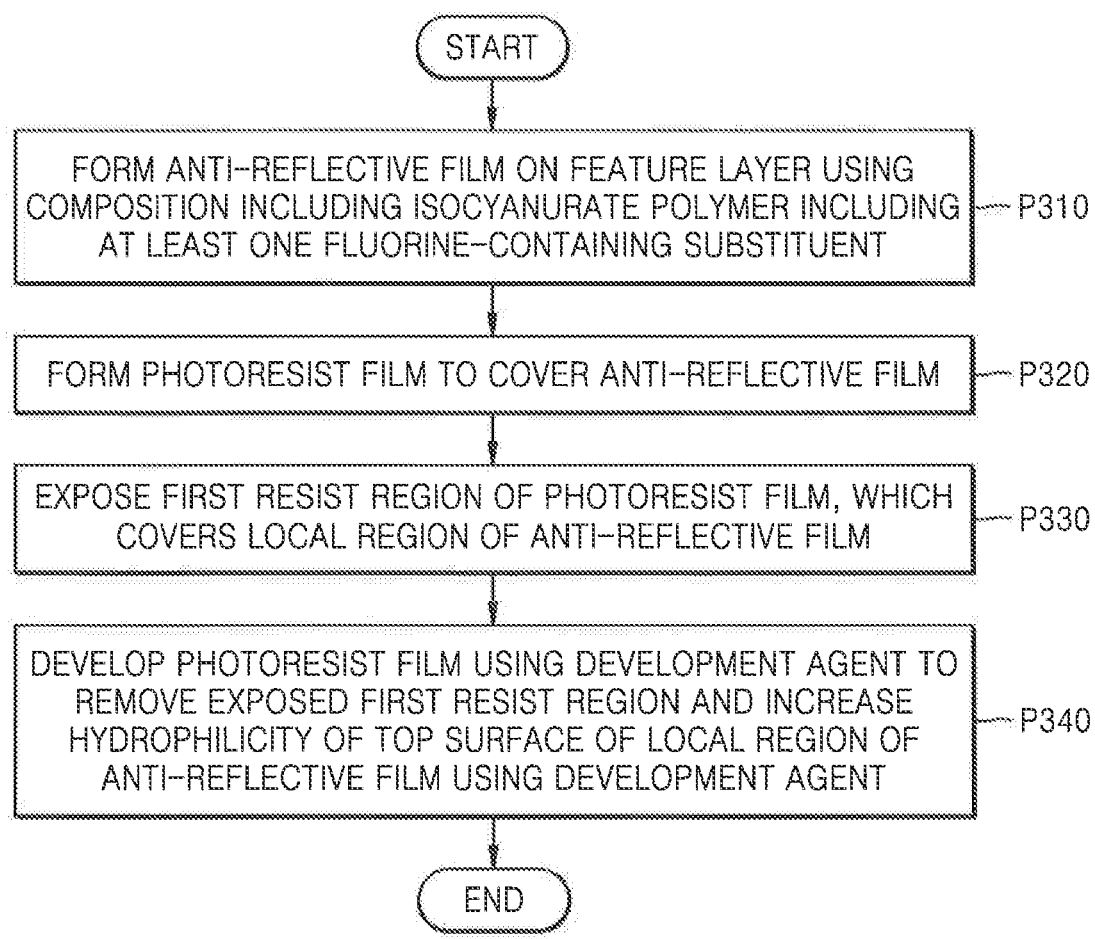
FIG. 4 is a flowchart of a method of manufacturing an IC device, according to exemplary embodiments of the present inventive concepts.

FIG. 4 is a flowchart of a method of manufacturing an IC device, according to an exemplary embodiment of the present inventive concepts.

A method of manufacturing the IC device, according to exemplary embodiments of the present inventive concepts, will be described with reference to FIGS. 2A to 2G and 4.

Referring to FIGS. 2A and 4, in process P310, an anti-reflective film 120 may be formed on a feature layer 110 using a composition including an isocyanurate polymer containing at least one fluorine-containing substituent.

The isocyanurate polymer may have a repeating unit represented by Formula 1. The at least one fluorine-containing substituent may include at least one of $R_1$, $R_2$, and $R_3$ of Formula 1. The anti-reflective film 120 may be formed on the feature layer 110 using the same method as that described in process P10 of FIG. 1.

Referring to FIGS. 2B and 4, in process P320, a photoresist film 130 may be formed to cover the anti-reflective film 120, using the same method as that described in process P20 of FIG. 1.

Referring to FIGS. 2C and 4, in process P330, a first resist region 130A of the photoresist film 130 may be exposed to light using the same method as that described in process P30 of FIG. 1.

Referring to FIGS. 2D and 4, in process P340, the photoresist film 130 (refer to FIG. 2C) may be developed using a development agent 150 in the same manner as that described in process P40 of FIG. 1 to form a photoresist pattern 130P. The hydrophilicity of a top surface of the first local region 120A of the anti-reflective film 120 which is exposed to the light in process P330 is increased by undergoing a chemical reaction with the development agent 150.

As the hydrophilicity of the top surface 120AT of the first local region 120A increases, a contact angle of the top surface 120AT of the first local region 120A to DIW may be reduced. The reduced contact angle permits a residue of the first resist region to be clearly removed from the top surface 120AT of the first local region 120A.

Thereafter, at least some of the processes described with reference to processes P50 and P60 of FIG. 1 and FIGS. 2E to 2G may be performed as necessary.

In the method of manufacturing the IC device, according to the exemplary embodiments of FIGS. 2A to 2G and 4, CDs of processing regions or patterns to be formed by processing the feature layer 110 may be precisely controlled to improve a dimensional precision.

Hereinafter, examples of synthesis of polymers according to exemplary embodiments and examples of preparation and evaluation of compositions according to exemplary embodiments will be described. However, the exemplary embodiments of the present inventive concepts are not limited by the following descriptions of Examples of synthesis, Examples of preparation, and Evaluation Examples.

Example 1-1: Synthesis of Polymer 1A

Polymer 1A is a polymer of Formula 1, in which each of $R_1$, $R_2$, and $R_3$ is —$CH_2CF_3$, $R_4$ is an ethyl group (—$C_2H_5$), and $R_5$ is represented by Formula 3-1:

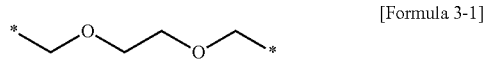 [SMILES: *COCCOC*]

[Formula 3-1]

wherein * is a bonding position (e.g., a binding site to a neighboring atom).

52.5 g of tris(1,3-oxathiolane-2-thion-5-ylmethyl)isocyanurate, 8.9 g of propylamine, 14.8 g of 1,2-bis(2-aminoethoxy)ethane, and 228 g of dimethylformamide were placed in a reactor and stirred at a temperature of about 85° C. for about 15 hours. Thereafter, a temperature of the reactor was lowered to room temperature of about 25° C., and 48.5 g of 3,3,3-trifluoropropionyl chloride was slowly added dropwise to the obtained reaction solution and further reacted at a room temperature of about 25° C. for about 10 hours. Afterwards, 45 g of an ion exchange resin (Amberite A21) was added to the obtained solution, and the reaction solution was stirred at room temperature for about 1 hour. The reaction solution was then filtered and added dropwise to normal heptane to obtain a precipitate. The precipitate was dried to obtain the polymer 1A. The obtained polymer 1A had a weight-average molecular weight Mw of about 2560 and a polydispersity index (PDI) of 1.56.

Example 1-2: Synthesis of Polymer 1B

Polymer 1B is a polymer of Formula 1 in which each of $R_1$, $R_2$, and $R_3$ is —$CF_2CF_3$, $R_4$ is an ethyl group (—$C_2H_5$), and $R_5$ is represented by Formula 3-1

The polymer 1B was obtained using the same method as in Example 1-1 except that 102.3 g of pentafluoropropionic anhydride was used instead of 48.5 g of 3,3,3-trifluoropropionyl chloride. The obtained polymer 1B had a weight-average molecular weight Mw of about 2540 and a PDI of 1.54.

Example 1-3: Synthesis of Polymer 1C

Polymer 1C is a polymer of Formula 1 in which each of $R_1$, $R_2$, and $R_3$ is —$CF_2CF_2CF_3$, $R_4$ is an ethyl group (—$C_2H_5$), and $R_5$ is represented by Formula 3-1

The polymer 1C was obtained using the same method as in Example 1-1 except that 135.3 g of heptafluoropropionic anhydride was used instead of 48.5 g of 3,3,3-trifluoropropionyl chloride. The obtained polymer 1C had a weight-average molecular weight Mw of about 2620 and a PDI of 1.65.

Example 1-4: Synthesis of Polymer 1D

Polymer 1D is a polymer of Formula 1 in which $R_1$ is —$OC(CH_3)_3$, each of $R_2$ and $R_3$ is —$CF_3$, $R_4$ is an ethyl group (—$C_2H_5$), and $R_5$ is represented by Formula 3-1 in Formula 1.

The polymer 1D was obtained using the same method as in Example 1-1 except that 22.4 g of trifluoroacetic chloride and 46.5 g of tert-butoxycarbonyl (BOC) anhydride were used instead of 48.5 g of 3,3,3-trifluoropropionyl chloride. The obtained polymer 11) had a weight-average molecular weight Mw of about 2720 and a PDI of 1.68.

Example 1-5: Synthesis of Polymer 1E

Polymer 1E is a polymer of Formula 1, in which each of $R_1$, $R_2$, and $R_3$ is —$OCH_2CF_3$, $R_4$ is an ethyl group (—$C_2H_5$), and $R_5$ is represented by Formula 3-1

The polymer 1E was obtained using the same method as in Example 1-1 except that 82.5 g of 3,3,3-trifluoropropionic anhydride was used instead of 48.5 g of 3,3,3-trifluoropropionyl chloride. The obtained polymer 1E had a weight-average molecular weight Mw of about 2540 and a PDI of 1.51.

Example 1-6: Synthesis of Polymer 1F

Polymer 1F is a polymer of Formula 1 in which each of $R_1$, $R_2$, and $R_3$ is —$CH_2CF_3$, $R_4$ is a pentyl group (—$C_5H_{11}$), and $R_5$ is represented by Formula 3-1.

The polymer 1F was obtained using the same method as in Example 1-1 except that 15.2 g of hexylamine was used instead of 8.9 g of propylamine. The obtained polymer 1F had a weight-average molecular weight Mw of about 2190 and a PDI of 1.59.

Example 1-7: Synthesis of Polymer 1G

Polymer 1G is a polymer of Formula 1, in which each of $R_1$, $R_2$, and $R_3$ is —$CH_2CF_3$, $R_4$ is an ethoxymethyl group (—$CH_2OC_2H_5$), and $R_5$ is represented by Formula 3-1

The polymer 1G was obtained using the same method as in Example 1-1 except that 13.4 g of 2-ethoxyethylamine was used instead of 8.9 g of propylamine. The obtained polymer 1G had a weight-average molecular weight Mw of about 2230 and a PDI of 1.54.

Example 1-8: Synthesis of Polymer 1H

Polymer 1H is a polymer of Formula 1 in which each of $R_1$, $R_2$, and $R_3$ is —$CH_2CF_3$, $R_4$ is an ethyl group (—$C_2H_5$), and $R_5$ is represented by Formula 3-2:

[Formula 3-2]

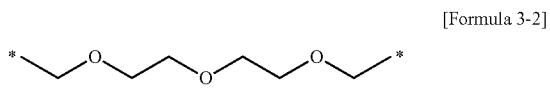

wherein * denotes a bonding position (e.g., a binding site to a neighboring atom).

The polymer 1H was obtained using the same method as in Example 1-1 except that 19.2 g of 1,2-tris (2-aminoethoxy) ethane was used instead of 14.8 g of 1,2-bis (2-aminoethoxy) ethane. The obtained polymer 1H had a weight-average molecular weight Mw of about 3210 and a PDI of 1.78.

Examples 2-1 to 2-8: Manufacture of Composition for Forming Anti-Reflective Film Compositions for forming anti-reflective films were prepared using polymer 1A to polymer 1H, which were obtained in Examples 1-1 to 1-8, respectively.

As a Comparative Example, a comparative composition was prepared that includes polyhydroxy styrene (PHS), which is one of the polymers having the repeating unit represented by Formula 2. The Comparative Example does not include a polymer having the repeating unit represented by Formula 1.

In each of Examples 2-1 to 2-8 and the Comparative Example, PL 1174 (Cytec Industries Inc., located in West Paterson, N.J.) was used as a crosslinking agent, pyridinium nonaflate was used as an acid generator, and a mixed solution PGMEA/PGME in which propylene glycol monomethyl ether acetate (PGMEA) and propylene glycol monomethyl ether (PGME) were mixed in a weight ratio of 7:3 was used as an organic solvent.

Detailed compositions of the example compositions for forming the anti-reflective films, which were obtained in Examples 2-1 to 2-8, and the comparative composition are shown in Table 1.

TABLE 1

|  | First polymer (content) | Second polymer (content) | Crosslinking agent (content) | Acid generator (content) | Solvent (content) |
|---|---|---|---|---|---|
| Example 2-1 | Polymer 1A (0.6 wt %) | PHS (2.4 wt %) | PL 1174 (0.2 wt %) | Pyridinium nonaflate (0.1 wt %) | PGMEA/PGME (96.7 wt %) |
| Example 2-2 | Polymer 1B (0.6 wt %) | PHS (2.4 wt %) | PL 1174 (0.2 wt %) | Pyridinium nonaflate (0.1 wt %) | PGMEA/PGME (96.7 wt %) |
| Example 2-3 | Polymer 1C (0.6 wt %) | PHS (2.4 wt %) | PL 1174 (0.2 wt %) | Pyridinium nonaflate (0.1 wt %) | PGMEA/PGME (96.7 wt %) |
| Example 2-4 | Polymer 1D (0.6 wt %) | PHS (2.4 wt %) | PL 1174 (0.2 wt %) | Pyridinium nonaflate (0.1 wt %) | PGMEA/PGME (96.7 wt %) |
| Example 2-5 | Polymer 1E (0.6 wt %) | PHS (2.4 wt %) | PL 1174 (0.2 wt %) | Pyridinium nonaflate (0.1 wt %) | PGMEA/PGME (96.7 wt %) |
| Example 2-6 | Polymer 1F (0.6 wt %) | PHS (2.4 wt %) | PL 1174 (0.2 wt %) | Pyridinium nonaflate (0.1 wt %) | PGMEA/PGME (96.7 wt %) |
| Example 2-7 | Polymer 1G (0.6 wt %) | PHS (2.4 wt %) | PL 1174 (0.2 wt %) | Pyridinium nonaflate (0.1 wt %) | PGMEA/PGME (96.7 wt %) |
| Example 2-8 | Polymer 1H (0.6 wt %) | PHS (2.4 wt %) | PL 1174 (0.2 wt %) | Pyridinium nonaflate (0.1 wt %) | PGMEA/PGME (96.7 wt %) |
| Comparative Example |  | PHS (3.0 wt %) | PL 1174 (0.2 wt %) | Pyridinium nonaflate (0.1 wt %) | PGMEA/PGME (96.7 wt %) |

Evaluation Examples 1-1 to 1-8: Evaluation of Characteristics of Anti-Reflective Film The compositions for forming the anti-reflective films obtained in Examples 2-1 to 2-8 were spin-coated on a silicon wafer and baked at a temperature of about 205° C. for 60 seconds to form anti-reflective films having a thickness of about 250 Å.

Refractive indices and extinction coefficients (k values) of anti-reflective films formed in Evaluation Examples 1-1 to 1-8 were measured using an ellipsometer (VUV-303, manufactured by J. A. Woolam).

Furthermore, each of the anti-reflective films formed in Evaluation Examples 1-1 to 1-8 was subjected to a bulk exposure process using an argon fluoride (ArF) exposure machine (ASML-1200B, manufactured by ASML), and the exposed anti-reflective films were developed using a track system. ACT-8 (manufactured by Tokyo Electron Limited (TEL)) was used as the track system, and 2.38% by weight of tetramethylammonium hydroxide (TMAH) aqueous solution was used as a development agent.

A contact angle of a top surface of each of the anti-reflective films to DIW was measured before each of the anti-reflective films formed in Evaluation Examples 1-1 to 1-8 was subjected to an exposure process and a development process (hereinafter, referred to as "before development"). A contact angle of the top surface of each of the anti-reflective films to DIW was also measured after each of the anti-reflective films formed in Evaluation Examples 1-1 to 1-8 was subjected to an exposure process (hereinafter, referred to as "after development"). To measure the contact angle, 5 µL of DIW was dropped on the top surface of each of the anti-reflective films using a contact angle measuring device (DSA-100S, manufactured by KRUSS), and an average value of the contact angles measured for 5 seconds was determined.

Table 2 shows measurement results of the refractive indices and the extinction coefficients (k values) of the anti-reflective films, which were obtained in Evaluation Examples 1-1 to 1-8, and measurement results of contact angles, which were respectively obtained before development and after development. Furthermore, Table 2 also shows measurement results of contact angles of the anti-reflective film according to the Comparative Example, which were respectively measured before development and after development using the same method as in Evaluation Examples 1-1 to 1-8.

TABLE 2

|  | Refractive index | k value | Contact angle (degrees) before development | Contact angle (degrees) after development |
|---|---|---|---|---|
| Example 2-1 | 1.91 | 0.27 | 65 | 52 |
| Example 2-2 | 1.90 | 0.27 | 68 | 53 |
| Example 2-3 | 1.86 | 0.28 | 69 | 57 |
| Example 2-4 | 1.86 | 0.27 | 73 | 59 |
| Example 2-5 | 1.84 | 0.28 | 71 | 59 |
| Example 2-6 | 1.89 | 0.26 | 71 | 60 |
| Example 2-7 | 1.86 | 0.28 | 65 | 56 |
| Example 2-8 | 1.82 | 0.26 | 70 | 60 |
| Comparative Example |  |  | 63 | 60 |

In the results shown in Table 2, the anti-reflective film according to the Comparative Example had a minute variation of about 3° in contact angle before and after development. In contrast, the anti-reflective film obtained using the composition including the polymer according to the exemplary embodiments had a relatively large variation in contact angle before development and after development. From the above results, in the anti-reflective film including the polymers 1A-1H according to Examples 2-1 to 2-8, it can be seen that, after the development process, fluorine-containing substituents exposed on a top surface of the anti-reflective film were dissolved due to a chemical reaction with the development agent so that a hydrophilicity of the top surface of the anti-reflective film was markedly increased.

Furthermore, as a result of measurements using a thickness measuring apparatus (Opti-2600, manufactured by KLA), it was confirmed that there were no substantial changes in the thicknesses of the anti-reflective films obtained using the composition including the polymers 1A-1H according to the exemplary embodiments. From these results, after the anti-reflective film obtained from the composition including the polymer according to Examples 2-1 to 2-8 undergo a development process, it can be seen that fluorine-containing substituents may be dissolved by the development agent only on the exposed surface of the anti-reflective film so that a polarity of the exposed surface of the anti-reflective film may be changed to an increased hydrophilicity. The increased hydrophilicity provides a reduced contact angle to DIW for the exposed surface of the anti-reflective film so that a residue of the exposed first resist region may be effectively removed in the development process and problems caused by photoresist residue remaining on the exposed surface are prevented.

While the present inventive concepts have been particularly shown and described with reference to exemplary embodiments thereof, it will be understood that various changes in form and details may be made therein without departing from the spirit and scope of the following claims.

What is claimed is:

1. A polymer having a repeating unit represented by Formula 1:

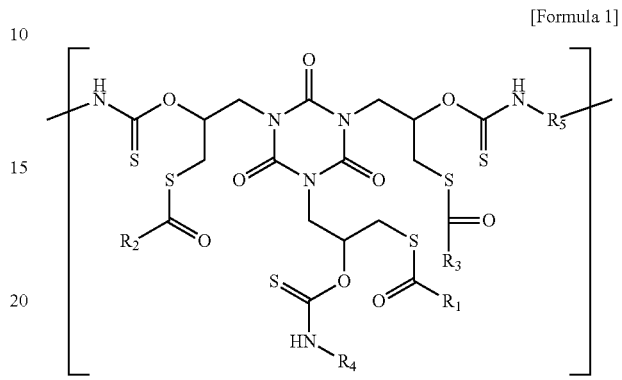

[Formula 1]

wherein each of $R_1$, $R_2$, and $R_3$ is independently selected from a substituted or unsubstituted C1-C6 saturated or unsaturated hydrocarbon group having 0 to 2 first heteroatoms or a substituted or unsubstituted C3-C6 cyclic saturated or unsaturated hydrocarbon group having 0 to 2 first heteroatoms, wherein at least one of $R_1$, $R_2$, and $R_3$ is a hydrocarbon group substituted with at least one fluorine atom, $R_4$ is a C1-C10 saturated or unsaturated hydrocarbon group having 0 to 2 second heteroatoms or a C3-C10 cyclic saturated or unsaturated hydrocarbon group having 0 to 2 second heteroatoms, and $R_5$ is a C1-C10 saturated or unsaturated hydrocarbon group having 1 to 6 third heteroatoms or a C3-C10 cyclic saturated or unsaturated hydrocarbon group having 1 to 6 third heteroatoms.

2. The polymer of claim 1, wherein the first heteroatoms are an oxygen atom (O), and each of the second heteroatoms and the third heteroatoms are at least one selected out of the oxygen atom (O) and a nitrogen atom (N).

3. The polymer of claim 1, wherein each of $R_1$, $R_2$, and $R_3$ is independently selected from a substituted or unsubstituted C1-C6 alkyl group, a substituted or unsubstituted C1-C6 heteroalkyl group, a substituted or unsubstituted C1-C6 alkoxy group, a substituted or unsubstituted C1-C6 heteroalkoxy group, a substituted or unsubstituted C2-C6 alkenyl group, a substituted or unsubstituted C2-C6 heteroalkenyl group, a substituted or unsubstituted C2-C6 alkynyl group, or a substituted or unsubstituted C2-C6 heteroalkynyl group.

4. The polymer of claim 1, wherein:
each of $R_1$, $R_2$, and $R_3$ is independently selected from —$CF_3$, —$CH_2CF_3$, —$CF_2CF_3$, —$CF_2CF_2CF_3$, —$OC(CH_3)_3$, —$OCH_2CF_3$, —$OCF_3$, or —$OCF_2CF_3$; and
at least one of $R_1$, $R_2$, and $R_3$ comprises the at least one fluorine atom.

5. The polymer of claim 1, wherein $R_1$, $R_2$, and $R_3$ have a same structure.

6. The polymer of claim 1, wherein two of $R_1$, $R_2$ and $R_3$ have a same structure.

7. The polymer of claim 1, wherein $R_4$ is selected from the following structures:

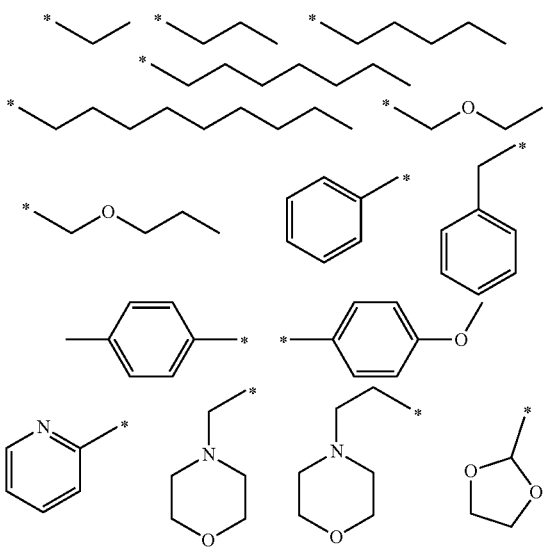

wherein * is a bonding position.

8. The polymer of claim 1, wherein $R_5$ is selected from the following structures:

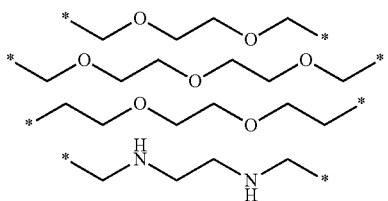

wherein * is a bonding position.

9. A composition comprising an organic solvent and a polymer having a repeating unit represented by Formula 1:

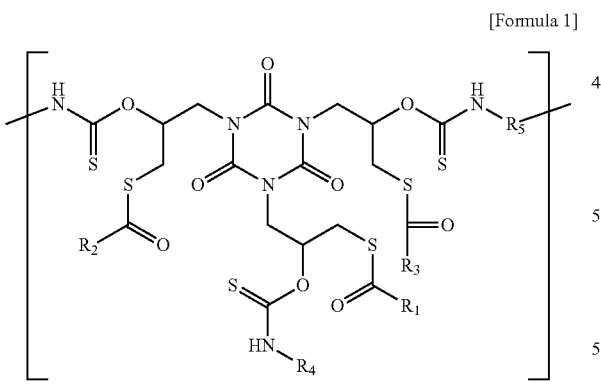

[Formula 1]

wherein each of $R_1$, $R_2$, and $R_3$ is independently selected from a substituted or unsubstituted C1-C6 saturated or unsaturated hydrocarbon group having 0 to 2 first heteroatoms or a substituted or unsubstituted C3-C6 cyclic saturated or unsaturated hydrocarbon group having 0 to 2 first heteroatoms, wherein at least one of $R_1$, $R_2$, and $R_3$ is a hydrocarbon group that is substituted with at least one fluorine atom, $R_4$ is a C1-C10 saturated or unsaturated hydrocarbon group having 0 to 2 second heteroatoms or a C3-C10 cyclic saturated or unsaturated hydrocarbon group having 0 to 2 second heteroatoms, and $R_5$ is a C1-C10 saturated or unsaturated hydrocarbon group having 1 to 6 third heteroatoms or a C3-C10 cyclic saturated or unsaturated hydrocarbon group having 1 to 6 third heteroatoms.

10. The composition of claim 9, wherein:

each of $R_1$, $R_2$, and $R_3$ is independently selected from —$CF_3$, —$CH_2CF_3$, —$CF_2CF_3$, —$CF_2CF_2CF_3$, —$OC(CH_3)_3$, —$OCH_2CF_3$, —$OCF_3$, or —$OCF_2F_3$; and at least one of $R_1$, $R_2$, and $R_3$ comprises the at least one fluorine atom.

11. The composition of claim 9, further comprising a polymer having a repeating unit represented by Formula 2:

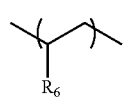

[Formula 2]

wherein $R_6$ is a C6-C12 saturated or unsaturated hydrocarbon group having 0 to 2 fourth heteroatoms.

12. The composition of claim 11, wherein $R_6$ is selected from one of the following structures:

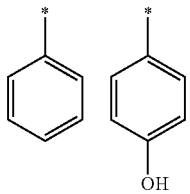

wherein * is a bonding position.

13. The composition of claim 9, further comprising at least one of a crosslinking agent and an acid generator.

* * * * *